(12) United States Patent
Miyajima et al.

(10) Patent No.: US 6,737,363 B2
(45) Date of Patent: May 18, 2004

(54) METHOD OF MANUFACTURING SEMICONDUCTOR DEVICE

(75) Inventors: Hideshi Miyajima, Yokohama (JP); Nobuhide Yamada, Tokyo (JP); Nobuo Hayasaka, Yokosuka (JP); Nobuyuki Kurashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 09/961,490

(22) Filed: Sep. 25, 2001

(65) Prior Publication Data

US 2002/0061657 A1 May 23, 2002

(30) Foreign Application Priority Data

Sep. 27, 2000 (JP) ........................................ 2000-295237

(51) Int. Cl.[7] .............................................. H01L 21/44
(52) U.S. Cl. ........................ 438/778; 438/778; 438/780; 438/781; 438/782; 438/787; 438/790
(58) Field of Search ................................ 438/778, 780, 438/781, 782, 787, 790, 597, 693, 745; 428/447; 521/77; 134/2; 427/240; 257/758

(56) References Cited

U.S. PATENT DOCUMENTS 6,046,112 A * 4/2000 Wang .......................... 438/693
6,420,469 B1 * 7/2002 Suda ........................... 438/693

FOREIGN PATENT DOCUMENTS

| WO | WO9729510 | * 8/1997 | ......... H01L/21/304 |
| WO | WO 00-39028 | 7/2000 | |

OTHER PUBLICATIONS

Wiederhorn, S.M., "Influence of Water Vapor on Crack Propagation in Soda–Lim e Glass", Journal of the American Ceramic Society, vol.50, No. 8, pp. 407–414, Aug. 1967.

Chinese Patent Office Action dated Nov. 14, 2003, and English translation thereof.

* cited by examiner

*Primary Examiner*—Matthew Smith
*Assistant Examiner*—Belur V Keshavan
(74) *Attorney, Agent, or Firm*—Finnegan, Henderson, Farabow, Garrett & Dunner, L.L.P.

(57) ABSTRACT

A method of manufacturing a semiconductor device according to an aspect of the present invention comprises forming a low dielectric constant insulating film having a siloxane bond as main skeleton on a semiconductor substrate, causing a surfactant to permeate the low dielectric constant insulating film, and conducting a predetermined step on the low dielectric constant insulating film permeated with the surfactant in a state adapted to be exposed to water.

6 Claims, 4 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2000-295237, filed Sep. 27, 2000, the entire contents of which are incorporated herein by reference.

BACKGROUND OF THE INVENTION

1. Field of the Invention

This invention relates to method of manufacturing a semiconductor device including a low dielectric constant insulating film.

2. Description of the Related Art

As miniaturization and operation speed of a semiconductor device progress, a wiring structure is shifting from monolayer to multilayer. At present, the semiconductor device having more than five metal wiring layers have been developed and manufactured. However, as miniaturization, operation speed, and multilayer progress, a problem of signal transmission delay attributable to the parasitic capacity between wires (so-called inter-wire parasitic capacity) and the wiring resistance of the device has become serious. The signal transmission delay is generally expressed as a product of the inter-wire parasitic capacity and the wiring resistance (CR time constant).

Various measures have been proposed to avoid the problem of signal transmission delay. For instance, in order to reduce the wiring resistance, it is proposed to use a Cu wire which has lower resistance than a popular Al wire. Conventionally, metal wire is formed by a dry etching process of a Cu film. However, the dry etching process of the Cu film is extremely difficult at present. Therefore, a damascene process is used for forming Cu wire at present.

On the other hand, in an attempt to reduce the inter-wire parasitic capacity, studies are being made of using low dielectric constant interlayer films such as SiOF films formed by CVD, so-called SOG (spin on glass) films formed by spin coating and organic resin (polymeric) films in place of currently popular silicon oxide ($SiO_2$) films formed by CVD.

Generally, it is believed that the relative dielectric constant of SiOF film can be reduced to about 3.3. However, from the viewpoint of the stability of performance, it will not be feasible to use the SiOF film showing a relative dielectric constant lower than above mentioned value $SiO_2$ film that has been popular shows a relative dielectric constant of 3.9.

To the contrary, it may highly probably possible to reduce the relative dielectric constant of low dielectric constant insulating film obtained by means of coating method to about 2.0 so that massive efforts are being made in this research area. Generally, the low dielectric constant insulating film is formed by means of coating method including three steps of:

(1) coating a surface of a semiconductor substrate with a thin film forming material uniformly by dropping the thin film forming material, and rotating the semiconductor substrate;

(2) placing the semiconductor substrate on a hot plate and heating the semiconductor substrate stepwise (e. g., at 100° C. for 1 minute and then at 200° C. for another 1 minute); and (3) baking the thin film forming material in an electric furnace (e. g., at 420° C. for 60 minutes).

Since the low dielectric constant insulating film has a low film density, its mechanical strength is lower than that of conventional $SiO_2$ film. Then, since the low dielectric constant insulating film has a low mechanical strength, its crack resistance is low. Thus, generally, the low dielectric constant insulating film having a siloxane (Si—O) bond as main skeleton becomes unable to withstand its own stress when the film thickness goes above 1 μm. Then, cracks can appear in the low dielectric constant insulating film.

It is known that the formation of cracks is accelerated by moisture. However, it is highly difficult to control the environment of forming low dielectric constant films so as to reduce the moisture without significantly raising the manufacturing cost.

BRIEF SUMMARY OF THE INVENTION

A method of manufacturing a semiconductor device according to an aspect of the present invention comprises:

forming a low dielectric constant insulating film having a siloxane bond as main skeleton on a semi-conductor substrate;

causing a surfactant to permeate the low dielectric constant insulating film; and conducting a predetermined step on the low dielectric constant insulating film permeated with the surfactant in a state adapted to be exposed to water.

A method of manufacturing a semiconductor device according to another aspect of the present invention comprises:

forming a low dielectric constant insulating film having a siloxane bond as main skeleton on a semiconductor structure including a substrate;

forming a film to be polished on the low dielectric constant insulating film; and polishing the film to be polished by a CMP process, to expose a part of the surface of the low dielectric constant insulating film and impregnate the low dielectric constant insulating film with a surfactant by way of the exposed surface.

A method of manufacturing a semiconductor device according to another aspect of the present invention comprises:

forming a low dielectric constant insulating film having a siloxane bond as main skeleton on a semiconductor structure including a substrate, the low dielectric constant insulating film being provided with a wiring groove in a surface thereof;

forming a conductive film on the low dielectric constant insulating film; and polishing the conductive film by using a CMP slurry including a surfactant to leave the conductive film in the wiring groove selectively and to expose a part of a surface of the low dielectric constant insulating film by removing the conductive film out of the wiring groove, the low dielectric constant insulating film being impregnated with the surfactant by way of an exposed surface thereof during a CMP process.

DETAILED DESCRIPTION OF THE INVENTION

Now, the present invention is further explained with referring to the accompanied drawings.

(1st Embodiment)

FIGS. 1A through 1G are cross sectional views of a manufacturing process of a multilayer wiring structure according to the first embodiment of the present invention. While the embodiment is explained in a case of a two-layered multilayer wiring structure for the purpose of simplification, it will be appreciated that, in actual process, for instance, five or six layered multilayer wiring structure is introduced.

Figure 1A:
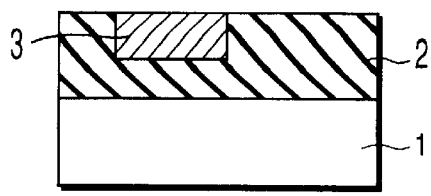
FIGS. 1A through 1G are cross sectional views of a manufacturing process of a multilayer wiring structure according to the first embodiment of the present invention.

FIG. 1A illustrates a semiconductor structure including a semiconductor substrate and the first wiring layer. In FIG. 1A, reference number 1 denotes a silicon substrate where elements (not shown) for example MOS transistors are integrated, reference number 2 denotes an interlayer insulating film 2 of the first layer, and reference number 3 denotes a metal wire of the first layer buried in the interlayer insulating film 2.

For instance, the metal wire 3 of the first layer is a Cu wire formed by a dual damascene process, which will be described hereinafter. In the case of Cu wire, a barrier metal film (not shown) needs to be formed. The metal wire may alternatively be an Al wire. For instance, the Al wire is formed by a so-called two-step reflow process. In this case, a liner film (not shown) needs to be formed. Still alternatively, the metal wire 3 may be a single damascene wire.

Figure 1B:
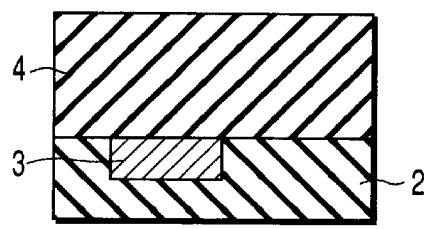

Next, as shown in FIG. 1B, a 1.5 µm thick low dielectric constant insulating film 4 (relative dielectric constant ≦3.3) having a siloxane (Si—O) bond as main skeleton is formed by coating method as an interlayer insulating film of the second layer on the interlayer insulating film 2 of the first layer (under layer) where the metal wire 3 is buried. In FIG. 1B and on, the silicon substrate 1 is omitted for the purpose of simplification.

The low dielectric constant insulating film 4 is a methylpolysiloxane film, which is formed in a manner as described below. Raw material varnish of a siloxane is dropped on the under layer, while the silicon substrate 1 is being rotated so that the raw material varnish may be uniformly coat the surface of the silicon substrate 1, and the raw material varnish is baked at 420° C. The relative dielectric constant of the low dielectric constant insulating film (methylpolysilaxane film) obtained in this manner was found to be equal to 2.8.

Figure 1C:
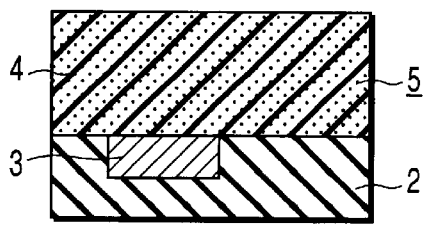

Next, as shown in FIG. 1C, impregnating the low dielectric constant insulating film 4 with surfactants 5. The low dielectric constant insulating film 4 contains a large number of pores therein so that the surfactants 5 permeate into the low dielectric constant insulating film 4 by way of those pores. Cationic polyoxyethylenealkylamine is used for the surfactant. More specifically, the surfactants 5 permeate into the low dielectric constant insulating film 4 by immersing the silicon substrate into an aqueous solution containing the surfactant. The low dielectric constant insulating film 4 is more porous than $SiO_2$ film. Therefore, the surfactants 5 permeates into the low dielectric constant insulating film 4 easily.

Figure 1D:
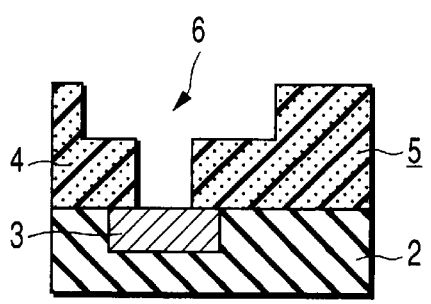

Next, as shown in FIG. 1D, a wiring groove and a hole which reaches to the metal wire 3 for the purpose of electrically connecting interlayer wires are formed in the low dielectric constant insulating film 4 by using photolithography and dry etching. Note that in FIG. 1D, the wiring groove and the hole are collectively denoted by reference number 6.

Because, as discussed above, the low dielectric constant insulating film 4 is impregnated with the surfactants 5, a coating performance of an anti-reflection film (not shown) that is used for the photolithography and a photoresist pattern (not shown) that is used for the dry etching improves.

Figure 1E:
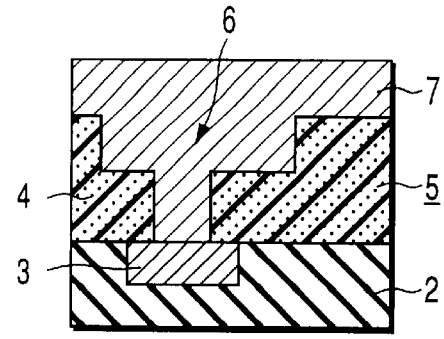

Next, as shown in FIG. 1E, a multilayer film 7 including a TaN film, a Ta film and a Cu film is formed on the entire surface by a conventional method in order to fill the wiring groove and hole 6. The TaN film and the Ta film of the multilayer film form a barrier metal film. The Cu film is the metal film as a main metal wiring portion. For instance, the Cu film is formed by plating. In this case a Cu film showing a satisfactory shape can be formed when a thin Cu film is formed in advance as seed layer.

Figure 1F:
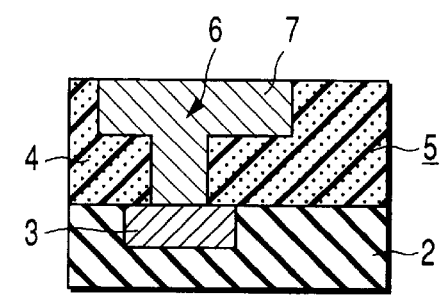

Next, as shown in FIG. 1F, the unnecessary parts of the Cu film and the barrier metal film located outside the wiring groove are removed by CMP (chemical mechanical polishing) process.

Figure 1G:
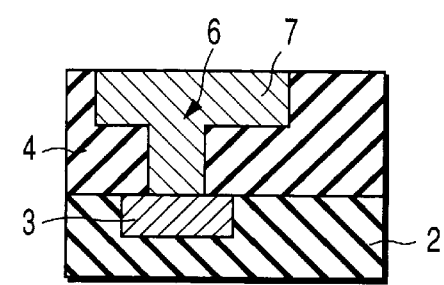

Finally, as shown in FIG. 1G, the surfactant 5 in the low dielectric constant insulating film 4 is removed by a heat treatment conducted at 350° C.

FIGS. 2A through 2E are cross sectional views of a conventional manufacturing process of a multilayer wiring structure. In FIGS. 2A through 2E, the parts that are similar to or same as those of FIGS. 1A through 1F are denoted respectively by the same reference numbers and will not be described any further.

Figure 2A:
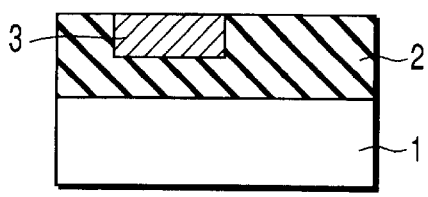
FIGS. 2A through 2E are cross sectional views of a conventional manufacturing process of a multilayer wiring structure.
Figure 2D:
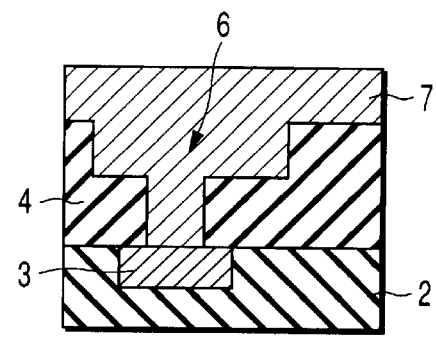
Figure 2B:
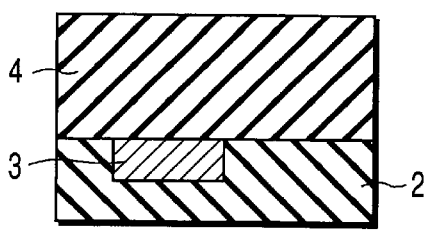
Figure 2E:
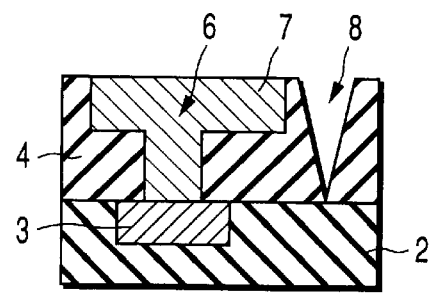
Figure 2C:
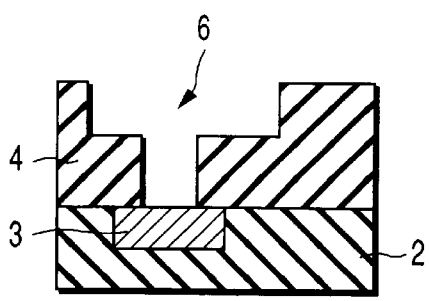

As shown in FIGS. 2A through 2D, in conventional process, the low dielectric constant insulating film 4 (1.5 µm)is formed without being impregnated surfactant 5 with, then, as shown in FIG. 2E, the multilayer film 7 outside of the wiring grooved is removed by a CMP process.

As shown in FIG. 2E, scratches 8 are formed in the low dielectric constant insulating film 4 which is not mechanically strong. Such scratches 8 can be caused by debris of multilayer 7 produced by the CMP process and the grain of polisher.

With a CMP process, cracks can grow from the scratches 8 as the low dielectric constant insulating film 4 is exposed to water. As far as this specification is concerned, the expression of "water" refers to both water in a liquid phase as contained in solutions such as slurry (with a limited volume) and moisture in a vapor phase as contained in air.

The inventors of the present invention looked into the relationship between the moisture in the environment (absolute humidity) and the rate of cracks which grow from the scratches on the low dielectric constant insulating film (1.5 µm thick) on both specimens impregnated with surfactants and those not impregnated with surfactants. Table 1 below summarily shows the obtained results.

TABLE 1

| Absolute humidity | 0 | 20 | 40 | 60 | 80 | 90 |
|---|---|---|---|---|---|---|
| Cracks growth rate ($\mu$m/min) (not impregnated with surfactant) | 0 | 0 | 1.9 | 2.2 | 5.8 | 7.2 |
| Cracks growth rate ($\mu$m/min) (impregnated with surfactant) | 0 | 0 | 0 | 0 | 0 | 0 |

As seen from Table 1, when the low dielectric constant insulating film is not impregnated with permeates (conventional process), the growth rate of cracks increases as the moisture increases. To the contrary, when the low dielectric constant insulating film is impregnated with surfactants (present embodiment), the growth of cracks is suppressed regardless of the amount of moisture in the environment. It is also known that the growth of cracks is accelerated in water. This may explain why cracks growth during the CMP process.

Figure 3A:
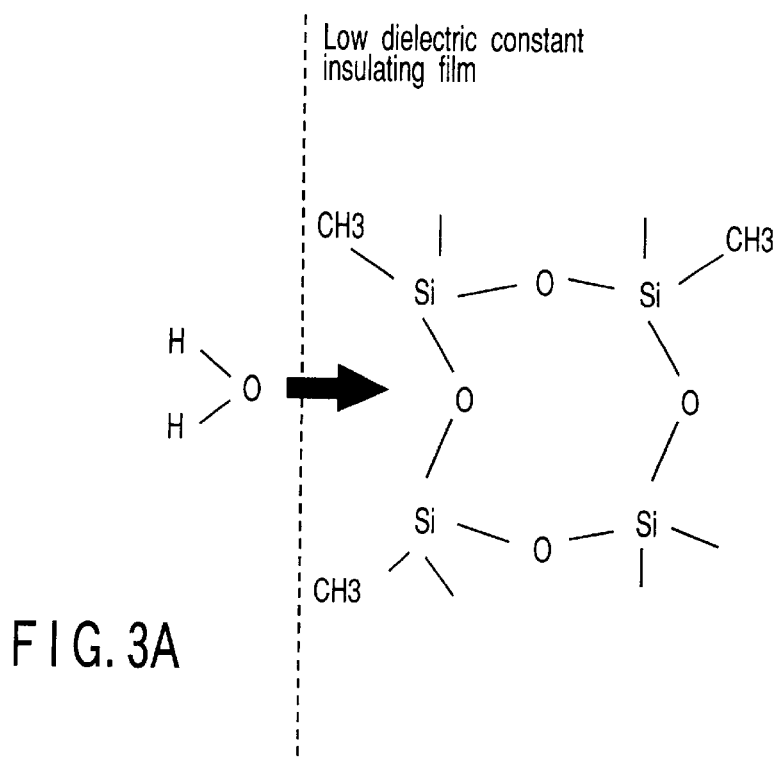
FIGS. 3A and 3B are schematic illustrations of the mechanism by which the formation of cracks in a low dielectric constant insulating film is accelerated by moisture.
Figure 3B:
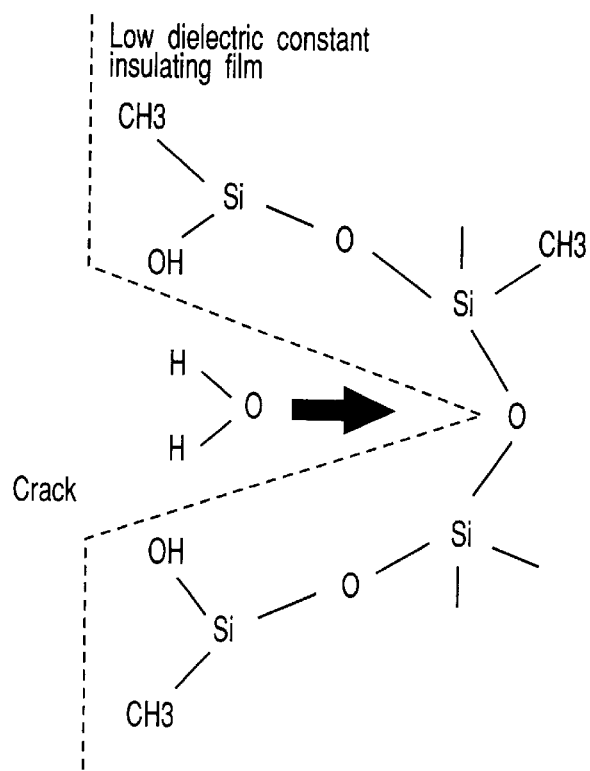
Figure 4A:
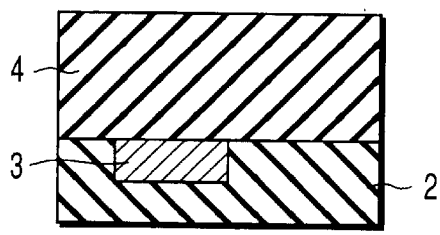
FIGS. 4A through 4E are cross sectional views of a manufacturing process of a multilayer wiring structure according to the second embodiment of the invention.
Figure 4B:
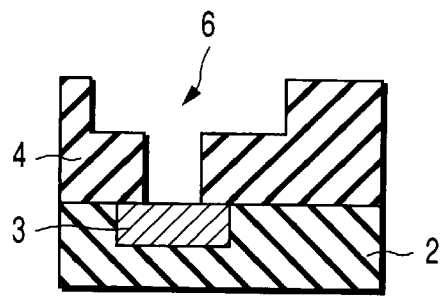
Figure 4D:
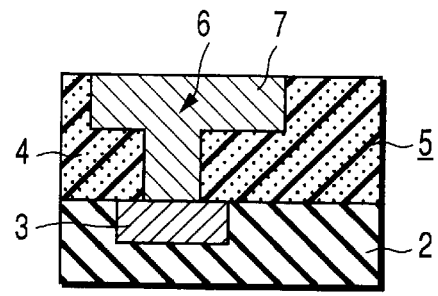
Figure 4E:
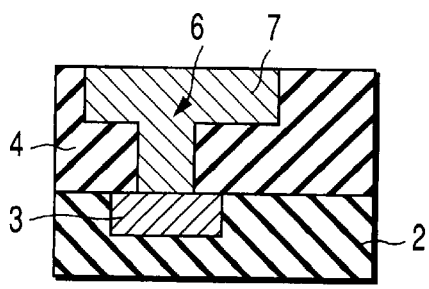
Figure 4C:
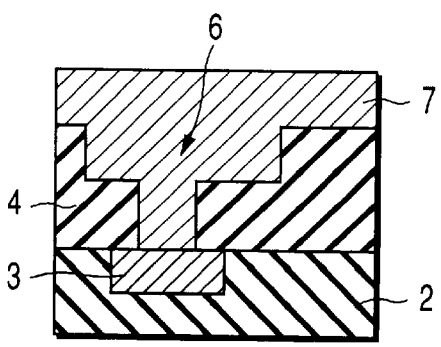

FIGS. 3A and 3B are schematic illustrations of the mechanism by which the formation of cracks in a low dielectric constant insulating film is accelerated by moisture. The low dielectric constant insulating film is subjected to stress referred to as tensile that makes the low dielectric constant insulating film shrunken. A hydrolytic reaction takes place due to the moisture in air and the Si—O—Si bond (siloxane bond) in the low dielectric constant insulating film. As a result, an Si—OH+Si—OH bond appears to bisect the original Si—O—Si bond. The bisecting reaction triggers a chain of similar reactions due to the moisture in air. The chain of reactions accelerates the growth of cracks. As cracks grow, the low dielectric constant insulating film is divided into small pieces, and each of the divided low dielectric constant insulating film shrinks to relax the stress acting on them.

Thus, with the above described embodiment, the low dielectric constant insulating film 4 is prevented from the absorption of water by the permeated surfactants 5. The cost of using the surfactant 5 is by far lower than the cost for controlling the amount of water low (conventional). Therefore, according to the present embodiment, the growth of cracks in the low dielectric constant insulating film 4 caused by water can be suppressed at low cost.

(2nd Embodiment)

FIGS. 4A through 4E are cross sectional views of a manufacturing process of a multilayer wiring structure according to the second embodiment of the invention.

In FIGS. 4A through 4E, the parts that are similar to or same as those of FIGS. 1A through 1E are denoted respectively by the same reference numbers and will not be described any further.

Present embodiment differs from the first embodiment in that the surfactants 5 permeates into the low dielectric constant insulating film 4 during the CMP process of the multilayer film 7.

More specifically, the surfactant 5 (e.g., cationic polyoxyethylenealkylamine) is mixed with the chemical for polishing to be used for the CMP process that is referred to as slurry so that, as the polishing the multilayer film 7 by CMP proceeds, and the surface of the low dielectric constant insulating film 4 is partly exposed, the surfactants 5 permeates into the low dielectric constant multilayer film 4 by way of the exposed surface area. As a result, the hygroscopic property of the low dielectric constant insulating film 4 is reduced to suppress the growth of cracks.

While embodiments of the present invention is described above, present invention is not limited thereto. For example, in the embodiments, the polymethylsiloxane film formed by coating is used as the low dielectric constant insulating film, it may be replaced by an $SiO_2$ film containing an organic ingredient and formed by CVD, an $SiO_2$ film containing hydrogen (e.g., hydrogensilesesquioxane, methylhydrogensiloxane, etc.) or some other low dielectric constant insulating film.

Additionally, cationic polyoxyethylenealkylamine is used for the surfactant 5 in the present embodiment, some other surfactants, for instance, 7-Hydroxy-5-methyl-1,3,4-triazaindolizine, dodecyl benzene sulfonic acid kalium, poly oxyethylene alkylamine, Maleic Acid, Quinaldic Acid, Ethylene diamine, Cetyl trimetyl ammonium chloride, or 4-amino-1,2,4-triazole may alternatively be used to provide the same effect. In other words, any of a variety of surfactants may be used to an extent that does not effect the slurry.

Additionally, while the embodiments are described in terms of prevention of absorption of water into the low dielectric constant insulating film, more specifically, the absorption of the water during the patterning step (FIG. 1D) or during the CMP step (FIG. 1F) is prevented, the present invention may also be applied to other steps of semiconductor device processing such as a step of transporting a semiconductor device or a step of storing a semiconductor device in the process of manufacturing the semiconductor device.

For instance, the present invention may be applied to the step of transporting a silicon substrate from a CMP apparatus to an apparatus for performing the next process on the silicon substrate or the step of storing the silicon substrate for some time after the CMP process when the next process is not performed immediately.

Furthermore, the present invention can be applied to at least two steps including the transport step and the storage step.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
   forming a low dielectric constant insulating film having a siloxane bond as main skeleton on a semiconductor structure including a substrate, the low dielectric constant insulating film being provided with a wiring groove in a surface thereof;
   forming a conductive film on the low dielectric constant insulating film;
   polishing the conductive film by using a CMP slurry including a surfactant to leave the conductive film in the wiring groove and removing the conductive film from the top of the low dielectric constant insulting film thus exposing the surface of the low dielectric constant insulating film to the surfactant; and
   conducting the semiconductor substrate to a following step in a state where the low dielectric constant insulating film is left impregnated with the surfactant.

2. The method according to claim 1, wherein the low dielectric constant insulating film is formed by one of coating method and CVD method.

3. The method according to claim 1, wherein
the low dielectric constant insulating film is an insulating film including a porous structure, the porous structure comprising a $SiO_2$ as main ingredient.

4. The method according to claim 1, wherein the relative dielectric constant of the low dielectric constant insulating film is not greater than 3.3.

5. The method according to claim 1, further comprising removing the impregnated surfactant out of the low dielectric constant insulating film.

6. The method according to claim 1, wherein the surfactant includes at least one of material selected from a group consisting of polyoxyethylenealkylamine, 7-Hydroxy-5-methyl-1,3,4-triazaindolizine, dodecyl benzene sulfonic acid kalium, poly oxyethylene alkylamine, Maleic Acid, Quinaldic Acid, Ethylene diamine, Cetyl trimetyl ammonium chloride, and 4-amino-1,2,4-triazole.

* * * * *

UNITED STATES PATENT AND TRADEMARK OFFICE
CERTIFICATE OF CORRECTION

PATENT NO. : 6,737,363 B2  
DATED : May 18, 2004  
INVENTOR(S) : Miyajima et al.

Page 1 of 1

It is certified that error appears in the above-identified patent and that said Letters Patent is hereby corrected as shown below:

<u>Column 6,</u>
Line 59, change "insulting" to -- insulating --.

Signed and Sealed this

Thirty-first Day of May, 2005

JON W. DUDAS
*Director of the United States Patent and Trademark Office*